United States Patent [19]

Kanbe

[11] Patent Number: 5,075,747
[45] Date of Patent: Dec. 24, 1991

[54] CHARGE TRANSFER DEVICE WITH MEANDER CHANNEL

[75] Inventor: Hideo Kanbe, Kanagawa, Japan

[73] Assignee: Sony Corporation, Tokyo, Japan

[21] Appl. No.: 589,690

[22] Filed: Sep. 28, 1990

[30] Foreign Application Priority Data

Sep. 28, 1989 [JP] Japan .................................. 1-250530

[51] Int. Cl.$^5$ ...................... H01L 29/78; G11C 19/28
[52] U.S. Cl. ................................................ 357/24; 377/61
[58] Field of Search ........................ 357/24; 377/57–63

[56] References Cited

U.S. PATENT DOCUMENTS

| | | | |
|---|---|---|---|
| 4,103,347 | 7/1978 | Barton | 357/24 R |
| 4,241,422 | 12/1980 | Gruter | 357/24 R |
| 4,291,239 | 9/1981 | Weimer | 357/24 LR |
| 4,380,056 | 4/1983 | Parrish et al. | 357/24 |
| 4,446,473 | 5/1984 | Pendleton | 357/24 LR |
| 4,531,225 | 7/1985 | Ohtsuki | 357/24 LR |
| 4,562,452 | 12/1985 | Tanikawa et al. | 357/24 R |
| 4,987,466 | 1/1991 | Shibata et al. | 357/24 M |

FOREIGN PATENT DOCUMENTS

| | | |
|---|---|---|
| 0333260 | 9/1989 | European Pat. Off. . |
| 60-41374 | 3/1985 | Japan . |
| 61-69173 | 4/1986 | Japan . |

OTHER PUBLICATIONS

Sei et al, "A Meander Channel CCD Linear Image Sensor", IEEE Trans. Electron Devices, vol. ED-25 (2/78), pp. 140–144.
Maekawa et al, "A 2048-Element MCCD Linear Image Sensor", Fujitsu Sci. & Tech. Journal (Japan), vol. 16 (1980), pp. 113–129.
"A Meander Channel CCD Linear Image Sensor", IEEE Journal of Solid-State Circuits, vol. SC-13, No. 1, Feb. 1978, pp. 66–70.

*Primary Examiner*—Gene M. Munson
*Attorney, Agent, or Firm*—Hill, Van Santen, Steadman & Simpson

[57] ABSTRACT

A charge transfer device comprises a plurality of charge transfer sections arranged in parallel. Each of the charge transfer sections has a first and second region in which respective storage regions are provided with shift each other to form meander charge transfer channels. Channel stop regions for isolating the storage regions are extended between the charge transfer section so that the second storage region of the second region of one charge transfer section corresponds to the first storage region of the first region of another charge transfer section. As a result, signal charges are transferred efficiently between the charge transfer sections.

6 Claims, 5 Drawing Sheets

CHARGE TRANSFER DEVICE WITH MEANDER CHANNEL

BACKGROUND OF THE INVENTION

1. Field of the invention

This invention relates to a charge transfer device such as a charge coupled device imager, and more particularly to a charge transfer device with meander channel.

2. Description of the Prior Art

In solid-state image pickup devices such as CCD imagers, there are ordinarily included light receiving areas arranged in a matrix manner. Signal charges generated in these light receiving areas are transferred to the horizontal register per each line through the vertical registers, and output signals are provided from the horizontal register through the output section.

Meanwhile, with the recent advancement of the imaging technology, realization of the high picture quality, the noninterlace of the monitor picture, and the like are being developed. In CCD imagers, a system of increasing the number of light receiving areas in a horizontal direction to provide a high horizontal resolution, and an entire pixel readout system, etc. are being studied.

For example, in the case of carrying out a readout by the entire pixel readout system, when a structure of a single horizontal register is employed, such a horizontal register must be driven by a clock frequency twice higher that of an ordinary interlace system. As a result, that transfer cannot be satisfactorily carried out.

To overcome this, there is known a technology in which a plurality of, such as, for example, two or three horizontal registers are employed. By increasing the number of horizontal registers, it is possible to reduce a clock frequency for drive.

Generally, the horizontal register has a structure in which a large number of transfer electrodes are arranged in a transfer direction on the gate insulating film.

However, when the horizontal resolution of a CCD imager including a horizontal register of such a structure is caused to be high, the pitch in a horizontal direction becomes narrow, so the transfer electrodes on the horizontal register are formed as a pattern short in a horizontal direction and long in a vertical direction. Further, since transfer between horizontal registers is carried out in a vertical direction which is the longitudinal direction of the pattern, a fringing electric field is difficult to be produced in the vertical direction. For this reason, transfer between horizontal registers cannot be efficiently carried out.

As the technology prior to this application, as described in the publication of the Japanese Patent Application Laid Open (KOKAI) No. 78572/84, there is known a CCD of so called a meander channel type in which the charge transfer path is formed as a zigzag pattern. The CCD of the meander channel type permits employment of a broad pitch width corresponding to one bit with respect to realization of high horizontal resolution, but does not refer by any means to the efficiency of transfer between horizontal registers as the point at issue.

SUMMARY OF THE INVENTION

It is an object of the present invention to provide a meander channel type charge transfer device in which signal charges are transferred efficiently between charge transfer sections.

According to the present invention, there is provided a charge transfer device having a plurality of charge transfer sections arranged in parallel. Each of charge transfer sections has two parts, a first region and a second region. The first and second region includes a plurality of first storage regions and second storage regions respectively. The first and second storage regions are arranged with shift along the transfer direction as to form meander channel. In the charge transfer sections, channel stop regions is formed to isolate the respective storage regions except for charge transfer paths between the first and second storage regions. A first electrodes is formed on the first region, and a second electrode is formed on the second region, respectively via a insulating layer. First and second transfer electrodes are provided on the charge transfer paths between the first and second storage regions to transfer signal charges. The first and second transfer electrodes are connected to the first and second electrode electrically.

The channel stop regions are extended between the charge transfer sections arranged in parallel so that one second storage region of the second region of the one charge transfer section corresponds to one first storage region of the first region of another charge transfer section, and transfer electrodes between charge transfer sections are formed on channel regions between the charge transfer sections between which the channel stop regions are put.

In the charge transfer device of this invention of such a structure, in the case of carrying out transfer of charges at respective charge transfer sections, a transfer signal is given so that the channel regions below the transfer electrode between transfer sections are placed in a cut OFF state, and the first and second regions, alternatively have a deep potential. Further, in the case of carrying out transfer of charges between charge transfer sections, a signal is given so that the channel regions below the transfer electrodes between transfer sections become conductive.

DESCRIPTION OF THE PREFERRED EMBODIMENT

This embodiment is directed to the example of a CCD of the interlace line transfer type wherein two horizontal registers are formed as parallel plural charge transfer sections.

Figure 3:
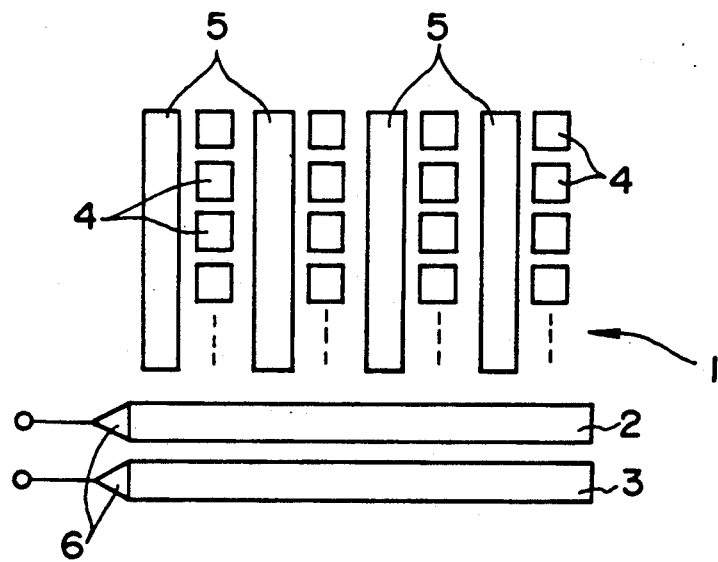
FIG. 3 is a block diagram showing the entire structure of the above-mentioned embodiment.

Referring to FIG. 3, the configuration of the entirety will be briefly described. A CCD 1 of this embodiment include parallel two horizontal registers 2, 3. At the terminating portions of these horizontal registers 2, 3, output sections 6, 6 are provided, respectively. At the side portion opposite to the horizontal register 3 of the horizontal register 2, light receiving sections 4 arranged in a matrix manner are provided. Further, vertical registers 5 are provided adjacently to the light receiving sections 4 every vertical columns. The CCD 1 of this structure is such that incident light rays are subjected to photoelectric conversion at respective light receiving sections 4 so that signal charges are generated. The signal charges thus provided are transferred to the vertical registers 5. From those vertical registers 5, signal charges are transferred to the horizontal registers 2, 3 every horizontal line. Thus, output signals are taken out from the output sections 6, 6 of the two horizontal registers 2, 3, respectively.

Figure 1:
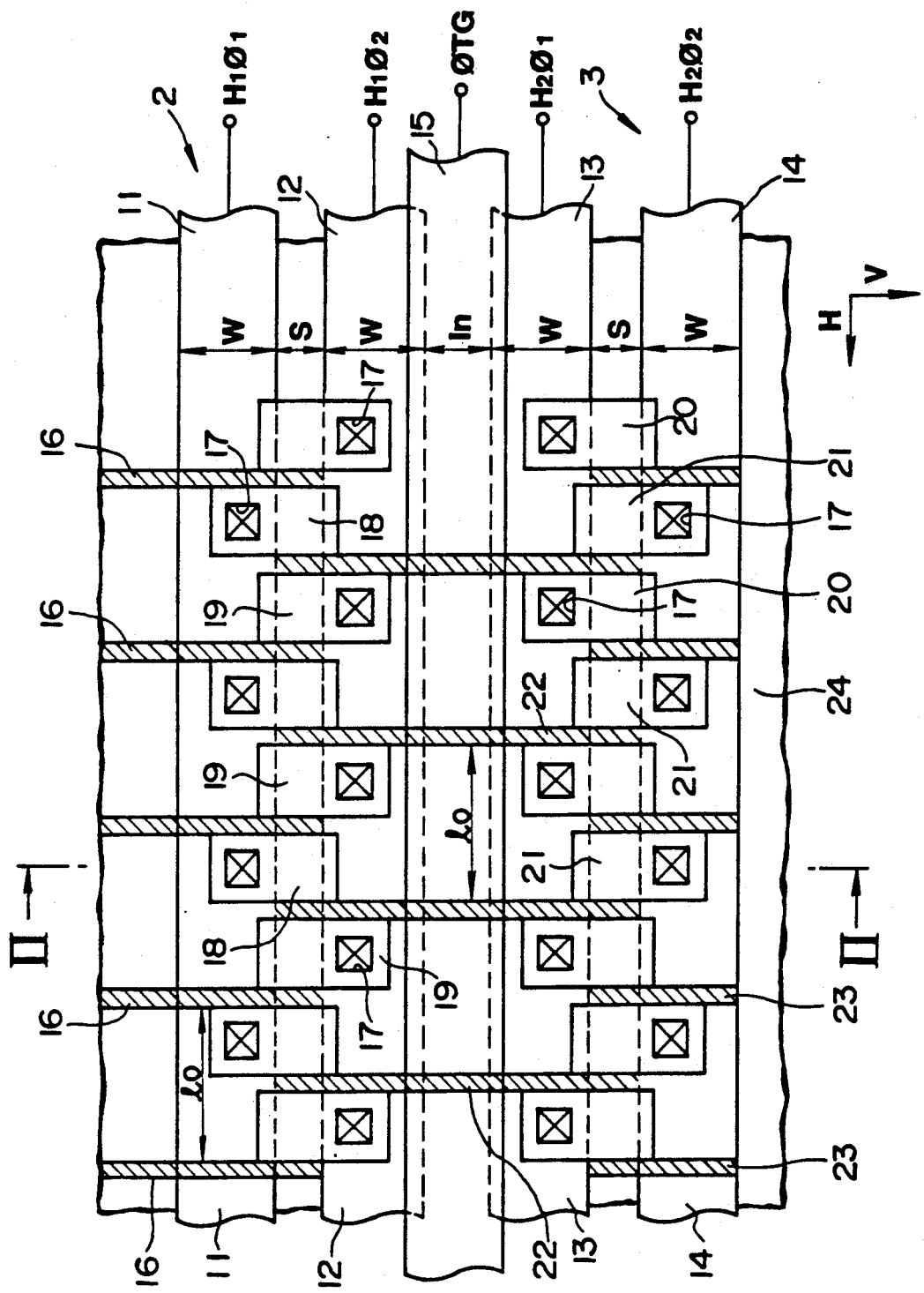
FIG. 1 is a plan view showing the essential part of an embodiment of a charge transfer device of this invention.
Figure 2:
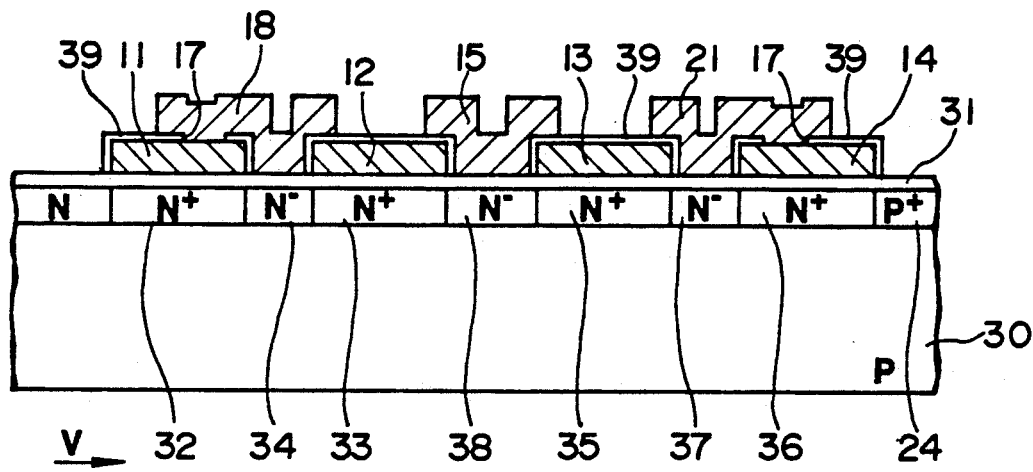
FIG. 2 is a cross sectional view taken along the II—II line of FIG. 1.

The configuration in plane of two horizontal registers 2, 3 of the CCD 1 of such a structure is shown in FIG. 1, and the cross section taken along the II—II line is shown in FIG. 2.

As shown in FIGS. 1 and 2, the horizontal register 2 includes a linear first electrode 11 and a linear second electrode 12 having the horizontal direction (direction H in the FIGURE) as the length direction and having line widths W, respectively. These first and second electrodes 11, 12 are formed by patterning a polysilicon layer of the first layer. The first and second electrodes 11, 12 are spaced by the size S. Below the first electrode 11, a p-type silicon substrate 30 exists through a silicon oxide film 31. In the surface of the p-type silicon substrate 30 below the first electrode 11, an n+ type impurity region 32 as the first region is formed. Similarly in the surface of the silicon substrate 30 below the second electrode 12, an n+ type impurity region 33 as the second region is formed through the silicon oxide film 31. The silicon oxide film 31 serves as a gate oxide film.

The n+ type impurity region 32 below the first electrode 11 is partitioned per each bit in a direction H by channel stop regions 16. The channel stop regions 16 are each comprised of a p+ type impurity region formed in of the surface of the silicon substrate 30, and are formed as a plurality of elongated patterns respectively having V-direction as the length direction. These channel stop regions 16 are contiguous to the channel stop regions of the vertical registers and terminate at the portion where they reach the second electrode 12. The distances $l_0$ between respective patterns of the channel stop regions 16 are equal to the pitches between the vertical registers, and are set to the same intervals $l_0$ with respect to each bit. The n+ type impurity region 32 partitioned by the channel stop regions 16 in this way is caused to serve as a plurality of first storage sections arranged in the direction H.

The n+ type impurity region 33 below the second electrode 12 is partitioned per each bit in the direction H by channel stop regions 22. The channel stop regions 22 are each comprised of a p+ type impurity region formed in the surface of the silicon substrate 30 in the same manner as in the case of the channel stop regions 16, and are formed as a plurality of elongated patterns respectively having the direction V as a length direction. These channel stop regions 22 have a positional relationship such that they are shifted with respect to the channel stop regions 16 by a half bit in the direction H which is the direction of transferring charges, i.e., by the distance $l_{0/2}$ in the direction H. These channel stop regions 22 are formed in the direction V as patterns starting from the side portion of the first electrode 11 and terminating at the side portion of the second electrode 14 of the horizontal register 3 as described later. The distances $l_0$ between respective patterns of the channel stop regions 22 are also set to the same interval with respect to respective bits. The n+ type impurity region 33 partitioned by the channel stop regions 22 in this way is caused to serve as a plurality of second storage sections arranged in the direction H. These second and first storage sections are opposite to each other in a manner that they are shifted by the half bit in the direction H.

The regions between the first and second electrodes 11, 12 are allowed to serve as removed portions of the channel stop regions, and function as charge transfer paths. Namely, the regions of the spacing S between the electrodes 11, 12 are such that the channel stop regions 16 and the channel stop regions 22 are extended in the direction V one after another at intervals of half bits, and first and second transfer electrodes 18, 19 are formed one after another so as to cover the regions between respective channel stop regions 16, 22 leaving no space between them. These first and second transfer electrodes 18, 19 are each comprised of a polysilicon layer of the second layer, and have rectangular patterns, respectively. The first transfer electrodes 18 are connected to the first electrode 11 through contact holes 17 formed in interlayer oxide films 39 between the polysilicon layer of the first layer and the polysilicon layer of the second layer. Further, the second transfer electrodes 19 are connected to the second electrode 12 similarly through the contact holes 17 formed in the oxide films 39. The end portions in the direction V of the first transfer electrodes 18 overlap with the second electrode 12, and the end portions in the direction V of the second transfer electrodes 19 overlaps with the first electrode 11. Below the first and second transfer electrodes 18, 19, an n+ type impurity region 34 is formed through the silicon oxide film 31. Accordingly, the portions below the first and second transfer electrodes 18, 19 function as the transfer sections of the charge transfer sections. The potential below each first transfer electrode 18 interlocks with that of the first storage section, and the potential below each second transfer electrode 19 interlocks with that of the second storage section. It is to be noted that the channel stop regions in the region between the first and second electrodes 11, 12 may be formed by self-alignment after the polysilicon layer of the second layer is formed.

The horizontal register 3 has substantially the same structure as that of the horizontal register 2. Namely, the horizontal register 3 includes linear first and second electrodes 13, 14 respectively having line widths W and having the direction H in the figure as the length direction which are formed by patterning the polysilicon layer of the first layer, and the first and second electrodes 13, 14 are also spaced by the size S. Below the first electrode 13, there exists an n+ type impurity region 35 serving as a first region formed on the side of the surface of the p-type silicon substrate 30. Similarly on the side of the surface of the silicon substrate 30 below the second electrode 14, an n+ type impurity region 36 as a second region is formed through the silicon oxide film 31.

The n+ type impurity region 35 below the first electrode 13 and the n+ type impurity region 36 below the second electrode 14 are partitioned per each bit in the direction H by the channel stop regions 22, 23, respectively. These channel stop regions 22, 23 are each comprised of a p+ type impurity region formed on the side of the surface of the silicon substrate 30, and are formed as a plurality of patterns respectively having the direction V as the length direction. Further, the pitches in the direction H of respective channel stop regions 22, 23 are set to the same interval $l_0$ with respect to respective bits. As previously described, the channel stop regions 22 are extended in the direction V from the side portion of the first electrode 11 of the horizontal register 2 to the side portion of the second electrode 14 of the horizontal register 3. Further, the channel stop regions 23 each begins from the side portion of the first electrode 13 and becomes continuous to a device isolation region 24 outside the second electrode 14. These channel stop regions 22 have a positional relationship such that they are shifted with respect to the channel stop regions 23 by distance $l_0/2$ in the direction H which is the direction of transferring charges. Accordingly, the n+ type impurity regions 35, 36 are partitioned by the channel stop regions 22, 23 to form first and second storage sections, respectively. In the same manner as in the case of the horizontal register 2, these first and second storage sections are opposite to each other so that they are shifted by half bits in the direction H.

The region between the first and second electrodes 13, 14 of the horizontal register 3 is constituted in the same manner as in the case of the horizontal register 2. Namely, the region of the spacing S between these electrode 11, 12 is such that the channel stop regions 22, 23 are extended in the direction V one after another at intervals of half bits, and the removed portions of these channel stop regions serve as charge transfer paths. In order to cover portions between respective channel stop regions 22, 23 serving as the charge transfer paths leaving no space between them, the first and second transfer electrodes 20, 21 each comprised of a polysilicon layer of the second layer of the rectangular pattern are formed one after another. These first transfer electrodes 20 are connected to the first electrode 13 through the contact holes 17 formed in the interlayer oxide films 39, and the second transfer electrodes 21 are also connected to the second electrode 14 through the contact holes similarly formed in the interlayer oxide films 39. The end portions in the direction V of the first transfer electrodes 20 overlap with the second electrode 14, and the end portions in the direction V of the second transfer electrode 21 overlap with the first electrode 13. Below the first and second transfer electrodes 20, 21, an n+ type impurity region 37 is formed through the silicon oxide film 31. The first and second transfer electrodes 20, 21 and the n− type impurity region 37 have the same functions as those of the first and second transfer electrodes 18, 19 and the n− type impurity region 34, respectively. In the charge transfer in the direction H, the n− type impurity region 37 functions as a storage section. It is to be noted that the channel stop regions between the first and second electrodes 13, 14 may be similarly formed by self-alignment process after the polysilicon layer of the second layer is formed.

In the region of a width In between the charge transfer sections of the horizontal registers 2, 3, a transfer gate 15 serving as a transfer electrode between transfer sections is formed. This transfer gate 15 is composed of a polysilicon layer of the second layer, and is formed with the direction H being as the length direction. The end portion in the direction V of this transfer gate 15 overlaps with the second electrode 12 of the horizontal register 2 and the first electrode 13 of the horizontal register 3 through the oxide films 39 serving as the interlayer insulating layer. In the region of the width In below the transfer gate 15, as previously described, a plurality of channel stop regions 22 are formed at intervals of $l_0$ in the direction H, and these channel stop regions 22 are formed so as to traverse the width In, respectively. The region between which a pair of channel stop regions 22 are put is a channel region 38 comprised of an n− type impurity region, and serves as a charge transfer path when transfer between horizontal registers is carried out. As the result of the fact that the channel stop regions 22 are provided in this way, one first storage section of the horizontal register 2 is caused to correspond to one first storage section of the horizontal register 3 through the channel region 38 below the transfer gate 15.

The horizontal registers 2, 3 of such structure can carry out a charge transfer in the direction H and carry out a transfer in the direction V, i.e., a charge transfer from the horizontal register 2 to the horizontal register 3.

Figure 4:
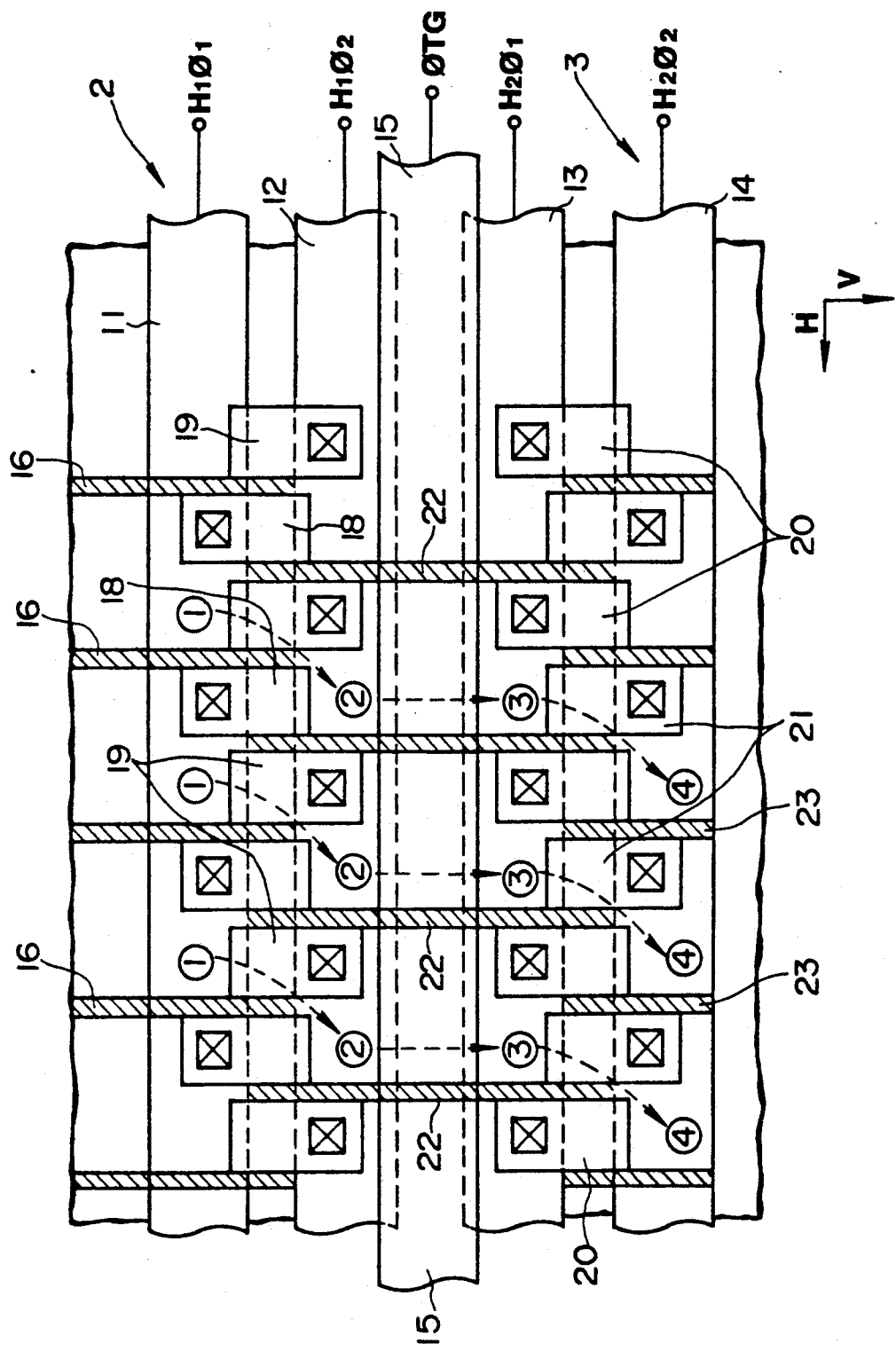
FIG. 4 is a plan view showing a direction in which charges flow at the time of vertical transfer in the above-mentioned embodiment.

Initially, vertical transfer between horizontal registers 2, 3 of the CCD 1 of this embodiment will be described with reference to FIGS. 4 and 6.

Figure 6:
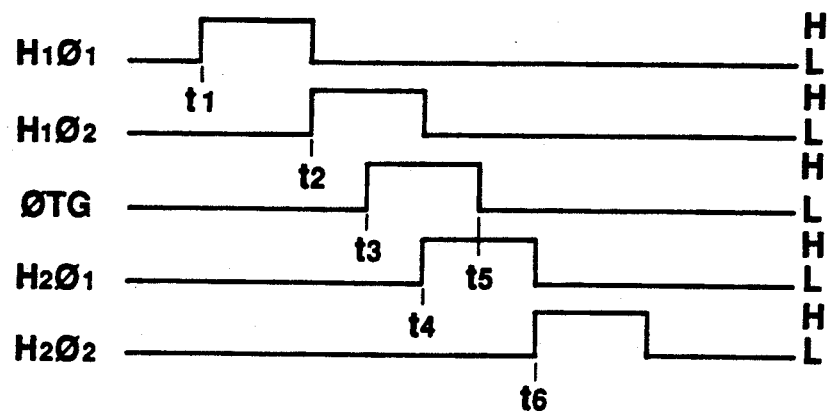
FIG. 6 is a waveform diagram showing respective signals at the time of vertical transfer in the above-mentioned embodiment.

At time $t_1$ of FIG. 6, a signal $H_1\phi_1$ delivered to the first electrode 11 of the horizontal register 2 is first caused to be at high (H) level, so a signal t and transfer from the vertical register 5 into the first region of the horizontal register 2 is carried out. Namely, signal charge generated by photoelectric conversion at the light receiving sections 4 are passed from the vertical registers 5 through the portions between respective channel stop regions 16, and are then stored into the n+ type impurity region 32 below the first electrode 11 of the horizontal register 2. This n+ type impurity region 32 is partitioned by the channel stop regions 16 per each bit, and respective sections are electrically connected through contact holes 17. Thus, the n− type impurity region 34 below the first transfer electrode 18 to which a signal $H_1\phi_1$ is given is caused to serve as a transfer section. Since a signal $H_1\phi_1$ delivered to the second transfer electrode 19 and the second electrode 12 is at low (L) level at the time $t_1$, signal charges are stored only into the portion below the first electrode 11.

At time $t_2$, the signal $H_1\phi_1$ charges to L level and the signal $H_1\phi_2$ changes from L level to H level. As a result, the potential well below the first electrode 11 and the first transfer electrode 18 becomes shallow, and the potential well below the second electrode 12 and the second transfer electrode 19 becomes deep. Thus, signal charge stored in the n-type impurity region 32 are stored into the n+ type impurity region 33 below the second electrode 12 through the portion below the second transfer electrode 19. In this transfer process, since the potential well below the first transfer electrode 18 is at all time shallower than that below the first electrode 11, sweeping away of signal charges to adjacent bits is avoided, so transfer of charges in a direction indicated by broken lines in FIG. 4 is necessarily carried out.

After charges have been transferred into the second storage section below the second electrode 12 as stated above, a signal $\phi TG$ delivered to the transfer gate 15 changes from L level to H level at time $t_3$. The channel region 38 below the transfer gate 15 becomes conductive by this signal $\phi$TG. so signal charges are transferred into the portion below the transfer gate 15.

At time $t_4$, the signal $H_2\phi_1$ delivered to the first electrode 13 of the horizontal register 3 changes from L level to H level. At the same time, the signal $H_1\phi_2$ delivered to the second electrode 12 of the horizontal register 2 changes from H level to L level. As a result, charges stored in the n+ type impurity region 33 below the second electrode 12 of the horizontal register 2 are transferred into the n+ type impurity region 35 below the first electrode 13 of the horizontal register 3 through the channel region 38 below the transfer gate 15 placed in a conductive state. At time $t_5$, the signal $\phi$TG delivered to the transfer gate 15 changes to L level, so the channel region 38 is in a cutoff state. At this time, signal charges are stored into the n+ type impurity region 35 below the first electrode 13 of the horizontal register 3.

At time $t_6$, the signal $H_2\phi_1$ delivered to the first electrode 13 of the horizontal register 3 shifts from H level to L level for a second time. The signal $H_1\phi_2$ delivered to the second electrode 14 of the same horizontal register 3 shifts in turn from L level to H level. By changes in these signals, signal charges are passed from the n+ type impurity region 35 below the first electrode 13 through the n− type impurity region 37 below the second transfer electrode 21, and are then stored into the n+ type impurity region 36 below the second electrode 14.

By changes in respective signals at times $t_1$ to $t_6$ of FIG. 6, signal charges are transferred in order of ① to ④ along the path indicated by broken lines.

Figure 5:
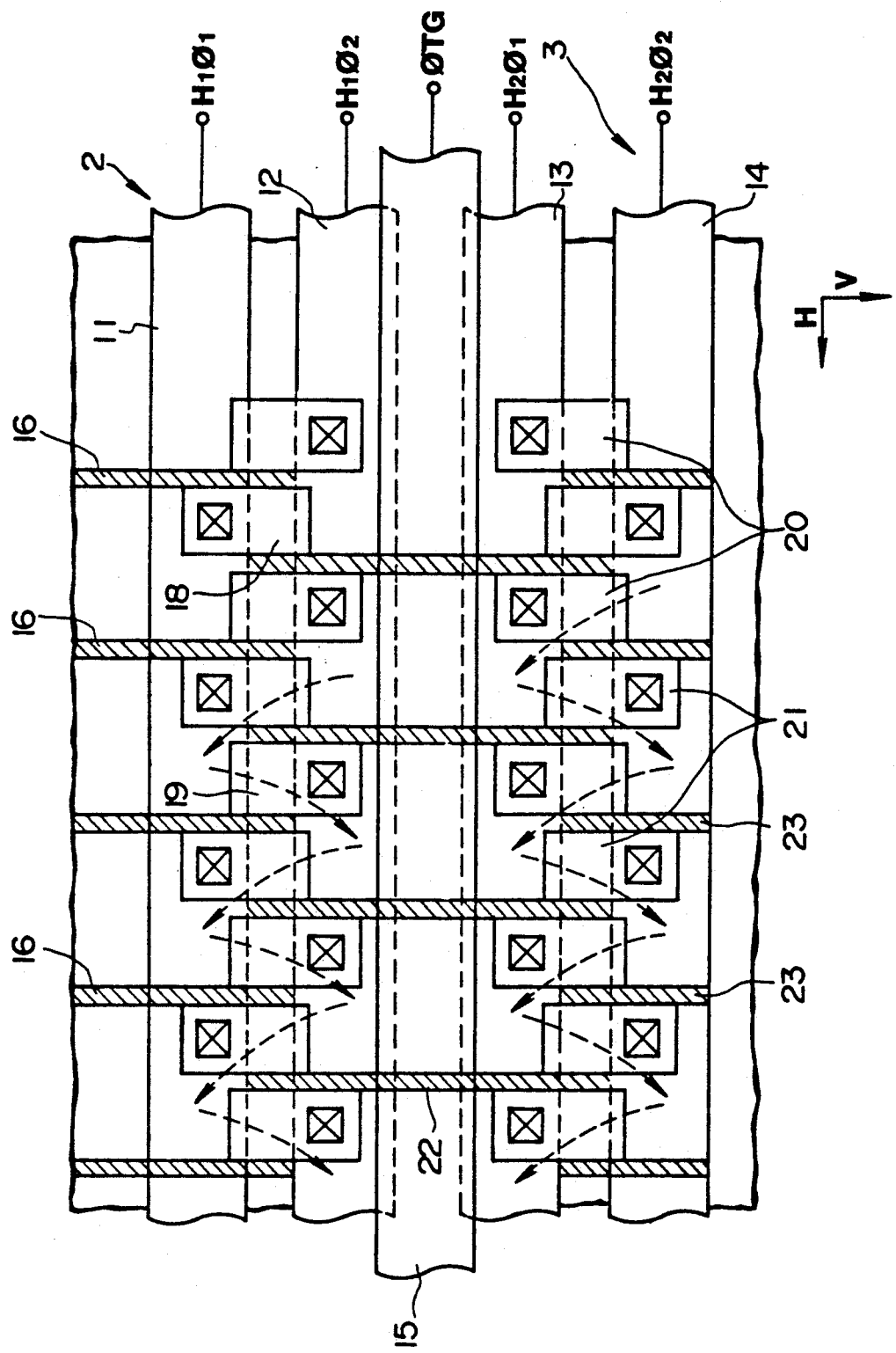
FIG. 5 is a plan view showing a direction in which charges flow at the time of horizontal transfer.

The horizontal transfer will now be described with reference to FIGS. 5 and 7.

Figure 7:
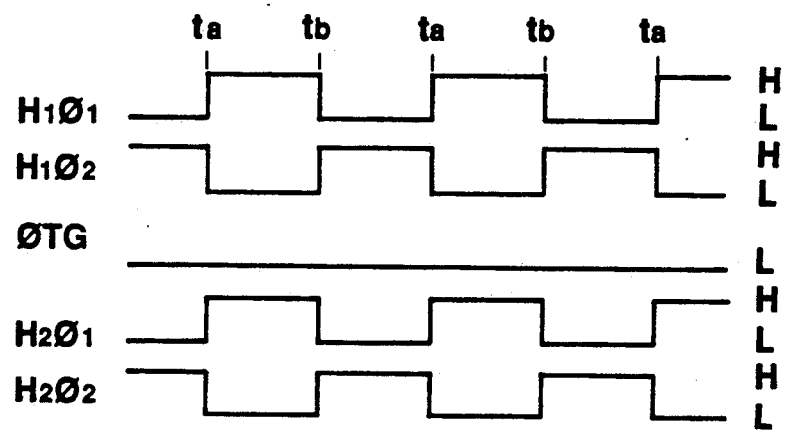
FIG. 7 is a waveform diagram showing respective signals at the time of horizontal transfer in the above-mentioned embodiment.

At the time of this horizontal transfer, as shown in FIG. 7, the signal $\phi$TG delivered to the transfer gate 15 is steadily placed at L level. Accordingly, the channel region 38 below the transfer gate 15 is maintained in a cut OFF state. No transfer takes place between horizontal registers 2 and 3.

In respective horizontal registers 2 and 3, clock signals are delivered to the first electrodes 11, 13 and the second electrodes 12 and 14, respectively. The signal $H_1\phi_1$ delivered to the first electrode 11 and the signal $H_1\phi_2$ delivered to the second electrode 12 of the horizontal register 2 are complementary clock signals. Similarly, the signal $H_2\phi_1$ delivered to the first electrode 13 and the signal $H_2\phi_2$ delivered to the second electrode 12 of the horizontal register 3 are also complementary clock signals. These clock signals all have the same frequency.

At time $t_a$ of FIG. 7, the signals $H_1\phi_1$ and $H_2\phi_2$ are placed at L level and the signals $H_1\phi_2$ and $H_2\phi_2$ are placed at L level. Thus, at the horizontal registers 2, 3, charges are transferred into the n+ type impurity region 32, 35 caused to serve as the first storage section below the first electrodes 11, 13 through the n− type impurity regions 34, 37 below the first transfer electrodes 18, 20, respectively.

At time $t_b$, the signals $H_1\phi_2$ and $H_2\phi_2$ are placed at L level and the signals $H_1\phi_2$ and $H_2\phi_2$ are placed at H level. As a result, signal charges stored in the first storage section below the first electrodes 11, 13 are transferred into the n+ type impurity regions 33, 36 caused to serve as the second storage section below the second electrodes 12, 14 through the n− type impurity regions 34, 37 below the second transfer electrodes 19, 21. At times subsequent thereto, the operations at the times $t_a$ and $t_b$ are repeatedly performed. As indicated by broken lines in FIG. 5, signal charges are transferred interchangeably through the first and second storage sections by half bit at respective clocks. Thus, they are transferred in the direction H.

The CCD 1 where both the transfer in the horizontal direction and the transfer in the vertical direction are carried out as stated above is such that transfer between horizontal registers in the vertical direction is implemented to the first storage section through the channel region 38 below the transfer gate 15 from the second storage section having a width $l_0$ corresponding to one bit partitioned by narrow channel stop regions 22. Specifically, the width $l_0$ of transfer between horizontal registers is set to a width twice larger than that of the conventional two-phase system which is not in the form of meander. Further, since transfer between horizontal registers 2, 3 is carried out only by the width (2 W+In) short in a direction V which is equal to the width 2 W of two electrodes plus the width In of the transfer gate, the fringing electric field is apt to be produced, resulting in an extremely high transfer efficiency.

Further, since the patterns of the channel stop regions 22, etc. may be narrow linear pattern, the channel region 38 can be broad area. In addition, this is convenient in processing, and is also advantageous in implementation of miniaturization.

It is to be noted that while the CCD imager has been described in this embodiment, this invention is not limited to such an embodiment, but may be applied to a device including parallel charge transfer sections. Further, while explanation has been made in this embodiment in connection with the example where two horizontal registers are provided, this invention is not limited to such an embodiment, but may be the example where three registers or more are provided.

What is claimed is:

1. A charge transfer device for transferring signal charge, comprising:
    a semiconductor body;
    a plurality of charge transfer sections arranged in parallel and formed in the surface of the semiconductor body including:
        a first region having a plurality of first storage regions which are arranged in a transfer direction of signal charges,
        a second region juxtaposed to the first region, the second region having a plurality of second storage regions which are arranged in the transfer direction, the second storage regions having a positional relationship which the second storage regions and the first storage regions are shifted each other,
        a plurality of channel stop regions for isolating the first and second storage regions from each other, respectively,
        a plurality of charge transfer paths between the first and second storage regions, the charge transfer paths being separated by the channel stop regions,
        a first electrode being provided on the first region via a insulating layer,
        a second electrode being provided on the second region via the insulating layer,
        a plurality of first transfer electrodes electrically connected to the first electrode being provided on every other the charge transfer path via the insulating layer, a plurality of second transfer electrodes electrically connected to the second electrode being provided on the charge transfer path between the first transfer electrodes, transfer gate means provided between the charge transfer sections arranged in parallel for controlling the transfer from one charge transfer section to another charge transfer section, wherein the channel stop regions are extended below the transfer gate means so that the second storage section of the second region of one charge transfer section correspond to the first storage section of the first region of another charge transfer section, wherein when signal charges are transferred inside of respective charge transfer sections, the first and second regions have a deep potential alternatively and the channels below the transfer gate means become cutoff, wherein when signal charge are transferred between the charge transfer sections, the first and second region have the different potentials and the channels below the transfer gate means become conductive.

2. A charge transfer device according to claim 1, wherein the first and second storage regions are shifted with a half bit each other in the transfer direction.

3. A charge transfer device according to claim 1, wherein the channel stop regions are formed in a stripe shape respectively.

4. A charge transfer device according to claim 1, wherein the first and second electrodes are formed by a first conductive layer on the insulating layer and the first and second transfer electrodes and the transfer gate means are formed by a second conductive layer.

5. A charge transfer device according to claim 4, wherein the channel stop regions are formed by self-alignment process in which the first and second conductive layers serve as a mask for ion implantation.

6. A charge transfer device according to claim 1, further comprising a plurality of light receiving sections for generating signal charges, arranged in a matrix configuration, and a plurality of vertical register for transferring the signal charges to the charge transfer sections.

* * * * *